US008647902B2

(12) United States Patent
Lee et al.

(10) Patent No.: US 8,647,902 B2
(45) Date of Patent: Feb. 11, 2014

(54) METHOD OF MANUFACTURING ARRAY SUBSTRATE FOR LIQUID CRYSTAL DISPLAY DEVICE

(75) Inventors: Ju-Ran Lee, Gyeonggi-do (KR); Jeong-Yun Lee, Seoul (KR); Hang-Sup Cho, Gyeonggi-do (KR); Doo-Hee Jang, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/563,917

(22) Filed: Aug. 1, 2012

(65) Prior Publication Data
US 2013/0109114 A1   May 2, 2013

(30) Foreign Application Priority Data

Nov. 1, 2011 (KR) .................... 10-2011-0112724

(51) Int. Cl.
| H01L 21/00 | (2006.01) |
| H01L 21/84 | (2006.01) |
| G02F 1/1343 | (2006.01) |
| H01J 9/24 | (2006.01) |
| H01L 29/04 | (2006.01) |
| H01L 29/10 | (2006.01) |

(52) U.S. Cl.
USPC ........... 438/30; 438/34; 438/151; 438/158; 349/141; 349/143; 349/147; 445/24; 257/59; 257/72; 257/E33.001; 257/E33.053; 257/E33.062; 257/E33.064

(58) Field of Classification Search
USPC ........... 438/30, 149, 151, 158, 104; 349/141, 349/143, 147; 445/24; 257/59, 72, E33.001, 257/E33.053, E33.062, E33.064
See application file for complete search history.

(56) References Cited

U.S. PATENT DOCUMENTS

| 6,788,355 | B1* | 9/2004 | Ihida et al. ............... 349/43 |
| 7,223,641 | B2* | 5/2007 | Maekawa .............. 438/149 |
| 7,776,635 | B2* | 8/2010 | Ahn et al. .............. 438/34 |
| 2005/0200791 | A1* | 9/2005 | Ahn ................. 349/141 |
| 2008/0116440 | A1* | 5/2008 | Ho et al. .................. 257/4 |
| 2009/0286360 | A1* | 11/2009 | Jo et al. ............... 438/149 |
| 2010/0044717 | A1* | 2/2010 | Choi et al. ............... 257/72 |
| 2010/0117086 | A1* | 5/2010 | Akimoto et al. ......... 257/57 |
| 2011/0019144 | A1* | 1/2011 | Koh et al. ............. 349/143 |

* cited by examiner

*Primary Examiner* — Mary Wilczewski
*Assistant Examiner* — Erik T Peterson
(74) *Attorney, Agent, or Firm* — Morgan, Lewis & Bockius LLP (57) ABSTRACT

A method of manufacturing an array substrate for a liquid crystal display device includes forming gate and data lines crossing each other on a substrate; forming a thin film transistor connected to the gate and data lines; forming a passivation layer on the substrate having the gate lines, data lines and the thin film transistor; forming a first conductive material layer on the passivation layer and connected to a drain electrode of the thin film transistor; oxidizing a surface of the first conductive material layer; forming a second conductive material layer on the oxidized first conductive material layer; forming a photoresist pattern on the second conductive material layer; etching the first and second conductive material layers using the photoresist pattern to form pixel and common electrodes which are alternately arranged in the pixel region and produces an in-plane electric field; and removing the photoresist pattern.

12 Claims, 8 Drawing Sheets

FIG. 5J
mixed etchant

METHOD OF MANUFACTURING ARRAY SUBSTRATE FOR LIQUID CRYSTAL DISPLAY DEVICE

CROSS REFERENCE TO RELATED APPLICATION

This application claims priority to and the benefit of Korean Patent Application No. 10-2011-0112724, filed in Korea on Nov. 1, 2011, which is hereby incorporated by reference for all purposes as if fully set forth herein.

BACKGROUND OF THE INVENTION

1. Field of the Invention

The present invention relate to a liquid crystal display device, and more particularly, to a method of manufacturing an array substrate for a liquid crystal display device.

2. Discussion of the Related Art

Until recently, display devices have typically used cathode-ray tubes (CRTs). Presently, however, many efforts and studies are being made to develop various types of flat panel displays, such as liquid crystal display (LCD) devices, plasma display panels (PDPs), field emission displays, and electro-luminescence displays (ELDs), as substitutes for the CRTs. Of these flat panel displays, LCD devices have many advantages, such as high resolution, light weight, thin profile, compact size, and low voltage power supply requirements.

In general, an LCD device includes two substrates that are spaced apart and face each other with a liquid crystal material interposed between the two substrates. The two substrates include electrodes that face each other such that a voltage applied between the electrodes induces an electric field across the liquid crystal material. Alignment of the liquid crystal molecules in the liquid crystal material changes in accordance with the intensity of the induced electric field into the direction of the induced electric field, thereby changing the light transmissivity of the LCD device. Thus, the LCD device displays images by varying the intensity of the induced electric field.

The LCD device using an electric field induced in a vertical direction has disadvantage in viewing angles. To solve this problem, an in-plane switching (IPS) mode LCD device using an in-plane electric field is proposed.

Figure 1:
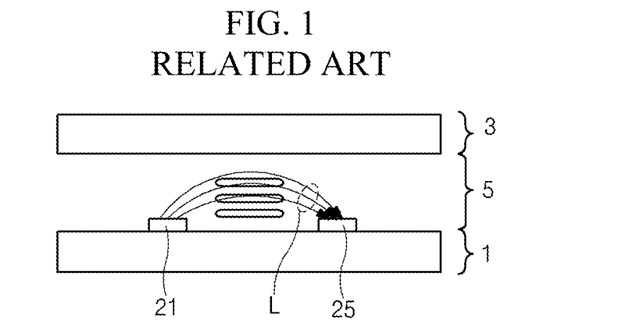
FIG. 1 is a schematic cross-sectional view illustrating an IPS mode LCD device according to a related art.

FIG. 1 is a schematic cross-sectional view illustrating an IPS mode LCD device according to the related art.

Referring to FIG. 1, the IPS mode LCD device includes an array substrate 1, a color filter substrate 3 and a liquid crystal layer 5.

The array substrate 1 includes pixel and common electrodes 25 and 21 producing an in-plane electric field L. The liquid crystal layer 5 is operated by an electric field L. This configuration makes viewing angles wide.

The pixel and common electrodes have a width of about 2.2 μm or less to improve aperture ratio and have a double-layered structure using different conductive materials to reduce reflectance for ambient light and improve ambient contrast ratio. However, the double-layered structure causes some problems as follows.

Figure 2:
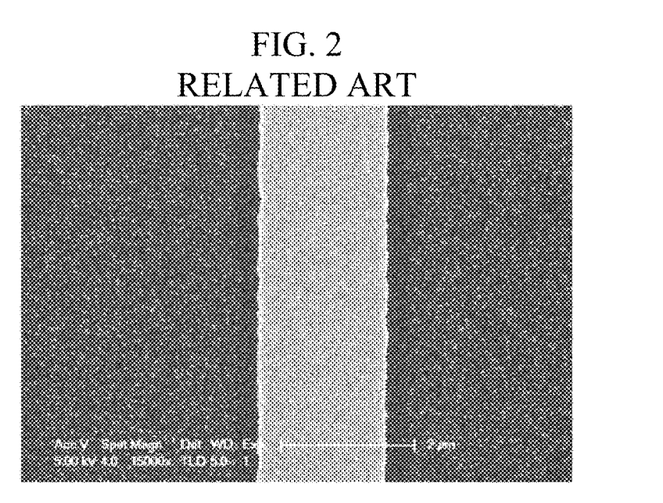
FIG. 2 is a picture illustrating a part of the second conductive material not etched but remaining as residues in a granular form according to the related art.

Referring to FIG. 2, which is a picture illustrating a part of the second conductive material not etched but remaining as residues in a granular form according to the related art, the residues in a granular form remains not only over the pixel and common electrodes 25 and 21 but also over a large area other than the pixel and common electrodes 25 and 21. Accordingly, the granular residues affect an electric field to operate the liquid crystal layer 5 and reduce response speed of liquid crystal thus. Further, since the granular residues acts as haze ingredients, brightness is reduced.

Further, the granular residues cause defects in rubbing an alignment layer which is formed on the pixel and common electrodes 25 and 21.

SUMMARY OF THE INVENTION

Accordingly, embodiments of the invention are directed to a method of manufacturing an array substrate for a liquid crystal display device which substantially obviates one or more of the problems due to limitations and disadvantages of the related art, and to other advantages.

An advantage of the embodiments of the invention is to provide an array substrate for a liquid crystal display device and a method of manufacturing the same that can improve aperture ratio, reduce reflectance for ambient light, and improve production efficiency. Additional features and advantages of the embodiments of the invention will be set forth in the description which follows, and in part will be apparent from the description, or may be learned by practice of the invention. These and other advantages of the invention will be realized and attained by the structure particularly pointed out in the written description and claims thereof as well as the appended drawings.

To achieve these and other advantages and in accordance with the purpose of the invention, as embodied and broadly described herein, a method of manufacturing an array substrate for a liquid crystal display device includes forming gate and data lines crossing each other on a substrate to define a pixel region; forming a thin film transistor connected to the gate and data lines; forming a passivation layer on the substrate having the gate lines, data lines and the thin film transistor; forming a first conductive material layer on the passivation layer and connected to a drain electrode of the thin film transistor; oxidizing a surface of the first conductive material layer; forming a second conductive material layer on the oxidized first conductive material layer; forming a photoresist pattern on the second conductive material layer; etching the first and second conductive material layers using the photoresist pattern to form pixel and common electrodes which are alternately arranged in the pixel region and produces an in-plane electric field; and removing the photoresist pattern.

It is to be understood that both the foregoing general description and the following detailed description and appended drawings are by way of example and explanatory, and are intended to provide a further explanation of the invention as claimed. The invention may admit to other equally effective embodiments.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE EMBODIMENTS

Reference will now be made in detail to the example embodiments of the invention, which are illustrated in the accompanying drawings.

Figure 3:
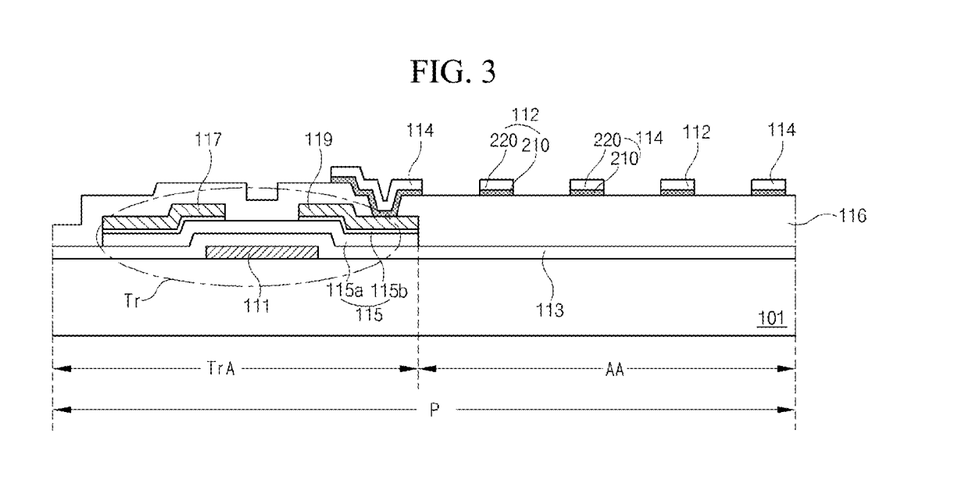
FIG. 3 is a cross-sectional view illustrating an IPS mode LCD device according to an embodiment of the invention.

FIG. 3 is a cross-sectional view illustrating an IPS mode LCD device according to an embodiment of the invention.

Referring to FIG. 3, the LCD device includes an array substrate, an opposing substrate, and a liquid crystal layer between the array substrate and the opposing substrate.

The array substrate includes gate and data lines crossing each other on a substrate 101 to define a pixel region P, and a common line spaced apart from and parallel with the gate line.

A thin film transistor Tr is in a switching region TrA near the crossing portion of the gate and data lines and connected to the gate and data lines. In a display region AA that is an active region to display images, pixel and common electrodes 114 and 112 are alternately arranged to produce an in-plane electric field.

The thin film transistor Tr includes a gate electrode 111, a gate insulating layer 113, a semiconductor layer 115 and source and drain electrodes 117 and 119. The semiconductor layer 115 includes an active layer 115a made of intrinsic amorphous silicon and an ohmic contact layer 115b made of impurity-doped amorphous silicon layer.

A passivation layer 116 is formed on the thin film transistor Tr, and the pixel electrode 114 is connected to the drain electrode 119.

Since the in-plane electric field is produced between the pixel and common electrodes 114 and 112, wide viewing angles can be achieved.

The pixel and common electrodes 114 and 112 of the embodiment each have a double-layered structure using different conductive materials.

A lower layer 210 of each of the pixel and common electrodes 114 and 112 may be made of an opaque conductive material, for example, molybdenum (Mo), molybdenum-titanium (MoTi), copper (Cu) or copper nitride (CuNx). An upper layer 220 of each of the pixel and common electrodes 114 and 112 may be made of a transparent conductive material, for example, indium-tin-oxide (ITO), indium-zinc-oxide (IZO) or aluminum-doped zinc oxide (AZO).

Accordingly, the pixel and common electrodes 114 and 112 is formed to have a narrow width of about 0.5 μm to about 2.2 μm. Therefore, aperture ration can be improved.

In other words, since liquid crystal is operated by the electric field between the pixel and common electrodes 114 and 112, liquid crystal located over the pixel and common electrodes 114 and 112 cannot be operated. Accordingly, aperture ratio is reduced by an area occupied by the pixel and common electrodes 114 and 112. However, the pixel and common electrodes 114 and 112 is formed to have a narrow width, and an area occupied by the pixel and common electrodes 114 and 112 is reduced. Accordingly, aperture ratio of the LCD device can be improved.

As described above, the double-layered pixel and common electrodes 114 and 112 uses the different conductive materials. Accordingly, a patterning process to form the pixel and common electrodes 114 and 112 is performed using a galvanic phenomenon which is a heavy corrosion phenomenon occurring in the more active conductive material because of a potential difference produced between the two different conductive materials when the different metals are exposed to a corrosion solution such as an etchant. Therefore, the pixel and common electrodes can be formed to have the narrow width.

Further, reflectance for ambient light can be reduced, and ambient contrast ratio can be thus improved. In other words, when the double-layered structure is configured using the different conductive materials coated with different thicknesses and different refractive indices, the differences make anti-reflection coating effect that lights reflecting from the double layers undergo destructive interference, and intensity of light reflecting from the LCD device can be thus reduced.

In addition, in this embodiment, when forming the pixel and common electrodes 114 and 112, a step of exposing the lower layer 210 to the atmosphere is eliminated. Accordingly, production efficiency can be improved, and the upper layer 220 can be prevented from growing along a direction of crystallization growth of the lower layer 210.

Figure 4:
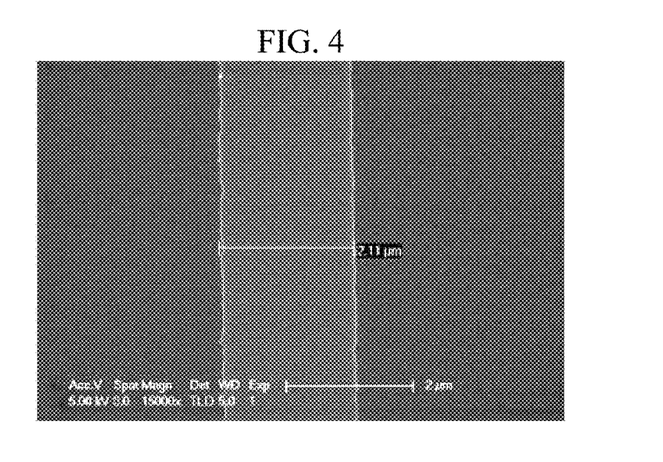
FIG. 4 is a picture illustrating no residues in a granular form remaining from a second conductive material layer according to the embodiment of the present invention.

Accordingly, as shown in FIG. 4, in an etching process, a part of the second conductive material (which the upper layer 220 of pixel and common electrodes 114 and 112 are made from) not etched but remaining as residues in a granular form can be prevented. Therefore, reduction of response speed of liquid crystal, reduction of brightness and defects in rubbing an alignment layer due to the residues can be prevented.

FIGS. 5A to 5K are cross-sectional view illustrating a method of manufacturing the LCD device according to the embodiment of the present invention. For the purpose of explanations, a region where a thin film transistor Tr is formed is defined as a switching region TrA, and an active region to display images is defined as a display region AA.

Figure 5A:
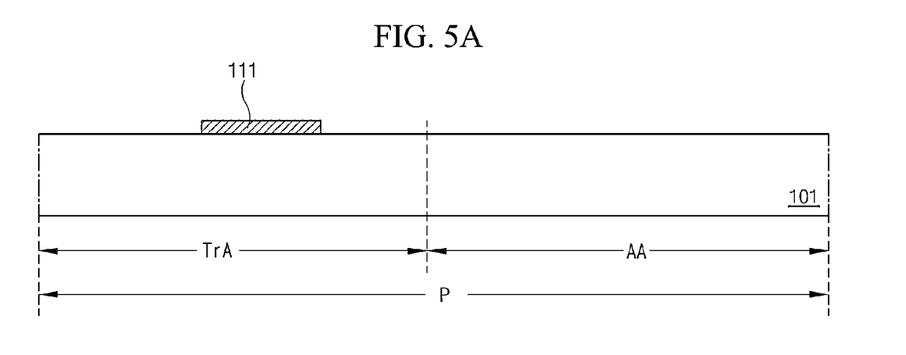
FIG. 5A to 5K are cross-sectional views illustrating a method of manufacturing the LCD device according to the embodiment of the present invention.

Referring to FIG. 5A, a first metal is deposited on a substrate 101 to form a first metal layer. The first metal may be at least one of molybdenum (Mo), aluminum (Al), aluminum alloy (e.g., AlNd), copper and copper alloy.

Then, a first mask process is performed to pattern the first metal layer and form a gate line along a first direction and a gate electrode 111 connected to the gate line. The first mask process may include forming a photoresist layer, light-exposing the photoresist layer using a photo mask, developing the photoresist layer to form a photoresist pattern, etching the first metal layer using the photoresist pattern, and stripping the photoresist pattern.

The first metal layer may have a single or multiple-layered structure. In forming the gate line and the gate electrode 111, a common line may be formed.

Figure 5B:
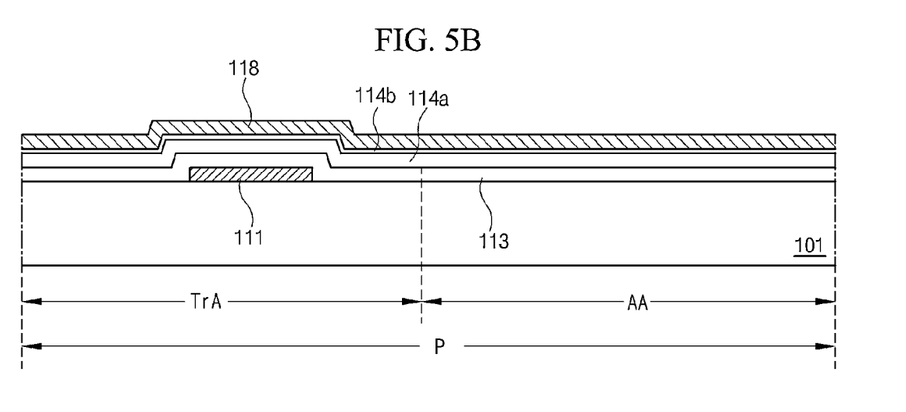

Then, referring to FIG. 5B, a gate insulating layer 113 is formed on the substrate 101 having the gate electrode 111. The gate insulating layer 113 may be made of an inorganic insulating material, for example, silicon oxide ($SiO_2$) or silicon nitride (SiNx).

Then, an intrinsic amorphous silicon layer 114a and an impurity-doped amorphous silicon layer 114b are sequentially formed on the gate insulating layer 113.

Then, a second metal layer 118 is formed on the impurity-doped amorphous silicon layer 114b. The second metal layer 118 may be made of at least one of copper (Cu), aluminum (Al), molybdenum (Mo) and copper alloy. Copper (Cu) has a resistivity less than aluminum (Al) and molybdenum (Mo), and a resistance of the second metal layer 118 made of copper (Cu) can be reduced.

Figure 5C:
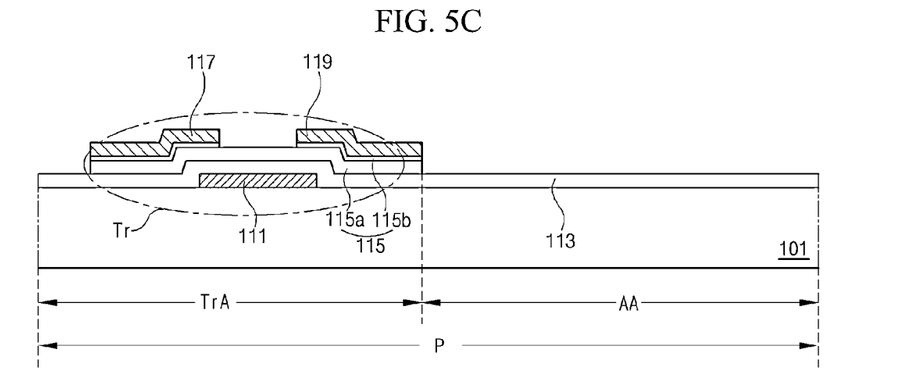

Then, referring to FIG. 5C, a second mask process is performed to pattern the second metal layer 118, the impurity-doped amorphous silicon layer 114b and the intrinsic amorphous silicon layer 114a, and thus to form a data line, source and drain electrodes 117 and 119, and a semiconductor layer 115. The data line is formed along a second direction crossing the first direction of the gate line, thereby defining a pixel region P. The source and drain electrodes 117 and 119 are spaced apart from each other. The patterned intrinsic amorphous silicon layer 114a becomes an active layer 115a.

Then, the patterned impurity-doped amorphous silicon layer 114b is further etched using the source and drain electrodes 117 and 119 as an etching mask so that a portion of the patterned impurity-doped amorphous silicon layer 114b corresponding to a region between the source and drain electrodes 117 and 119 is etched out. Accordingly, an ohmic contact layer 115b is formed.

The gate electrode 111, the gate insulating layer 113, the semiconductor layer 115 including the active layer 115a and the ohmic contact layer 115b, and the source and drain electrodes 117 and 119, as formed above, form the thin film transistor Tr.

Figure 5D:
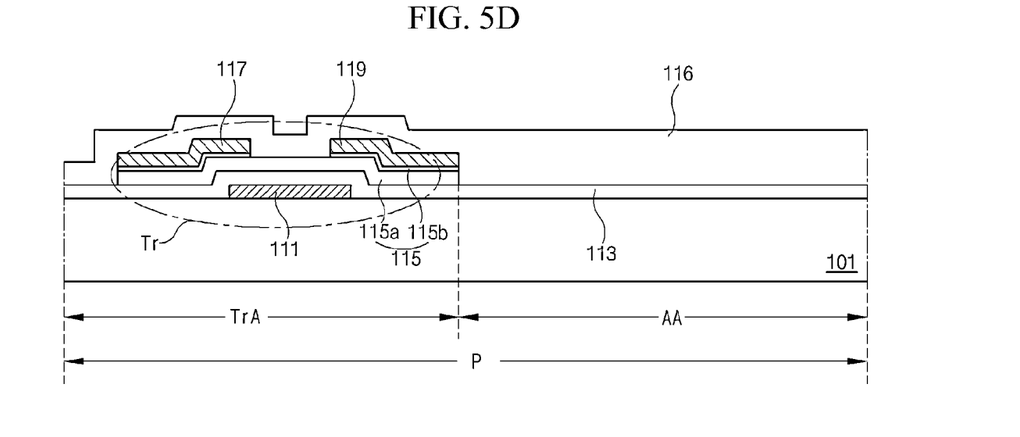

Then, referring to FIG. 5D, a passivation layer 116 is formed on the substrate 101 having the source and drain electrodes 117 and 119. The passivation layer 116 may be made of an inorganic insulating material, for example, silicon oxide ($SiO_2$) or silicon nitride (SiNx), or an organic insulating material, for example, benzocyclobutene (BCB) or photo acrylic.

Figure 5E:
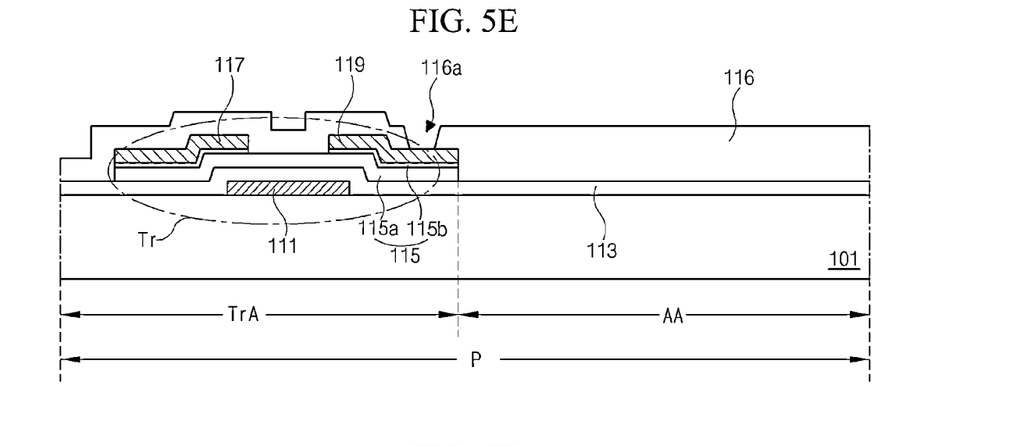

Then, referring to FIG. 5E, a third mask process is performed to pattern the passivation layer 116 and form a drain contact hole 116a exposing the drain electrode 119.

In the third mask process, a common line contact hole exposing the common line is further formed.

Figure 5F:
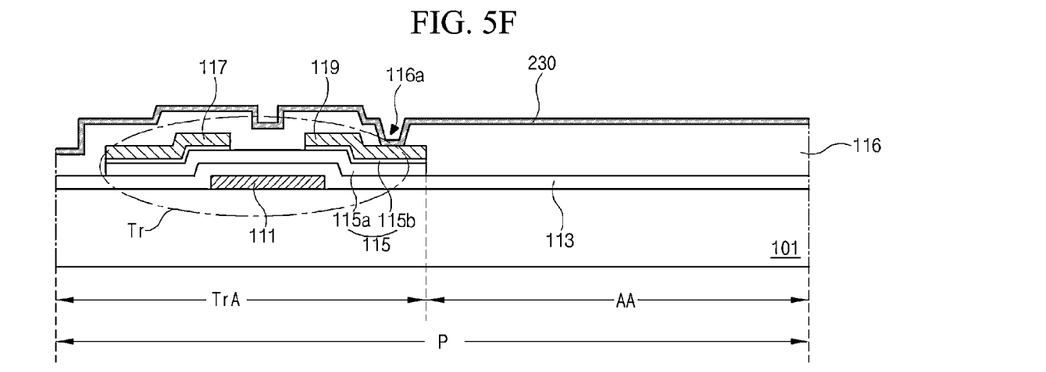

Then, referring to FIG. 5F, a first conductive material layer 230 is formed on the passivation layer 116. The first conductive material layer 230 may be made of an opaque conductive material, for example, molybdenum (Mo), molybdenum-titanium (MoTi), copper (Cu) or copper nitride (CuNx). The first conductive material layer 230 may have a thickness of about 50 Å to about 300 Å.

Figure 5G:
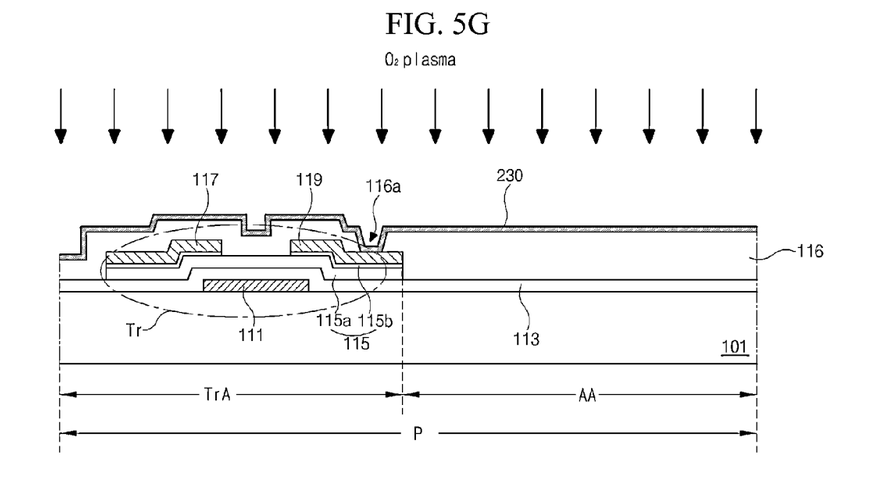

Then, the surface of the first conductive material layer 230 is oxidized. The oxidation may be performed by one of exposing the first conductive material layer 230 to an atmosphere condition, i.e., an air condition, exposing the first conductive material layer 230 to an oxygen gas, and treating the first conductive material layer 230 by an oxygen plasma. FIG. 5G shows the step of treating the first conductive material layer 230 by the oxygen plasma.

Referring to FIG. 5G, the substrate 101 having the first conductive material layer 230 is placed in a treatment chamber (330 or 340 of FIG. 7), which is capable of producing a plasma, and an oxygen treatment is performed onto the first conductive material layer 230.

When the first conductive material layer 230 is exposed to the $O_2$ plasma, an oxidation reaction occurs, and thus a surface of the first conductive material layer 230 is oxidized.

Figure 5H:
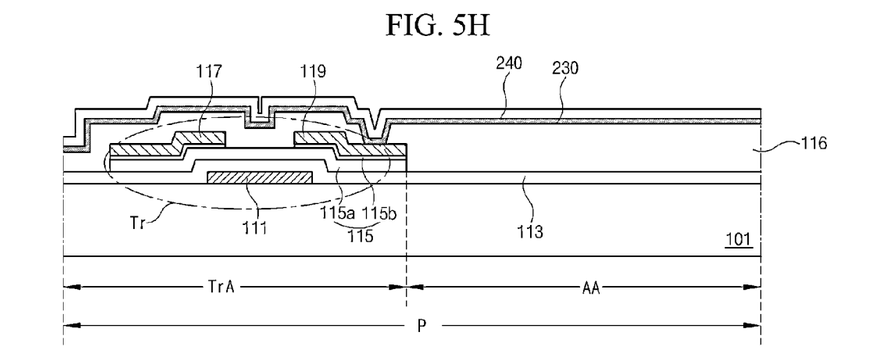

Then, referring to FIG. 5H, a second conductive material layer 240 is formed on the oxidized first conductive material layer 230. The second conductive material layer 240 may be made of a transparent conductive material, for example, indium-tin-oxide (ITO), indium-zinc-oxide (IZO) or aluminum-doped zinc oxide (AZO). The second conductive material layer 240 may have a thickness of about 200 Å to about 600 Å. The second conductive material layer 240 may be thicker than the first conductive material layer 230.

The reduction of light reflectance can be achieved by anti-reflection coating effect. In other words, when the double-layered structure is configured using two different materials deposited with different thicknesses and different refractive indices, the differences makes anti-reflection coating effect that lights reflecting from the double layers undergo destructive interference, and intensity of light reflecting from the LCD device can be thus reduced. It is preferred that the second conductive material layer is thicker than the first conductive material layer in order to further reduce light reflectance.

Figure 6A:
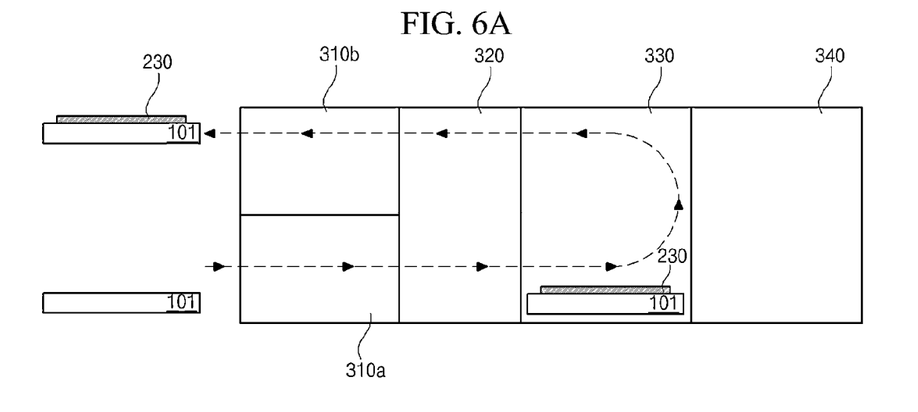
FIGS. 6A and 6B are schematic views illustrating processes of forming pixel and common electrodes using an inline type sputtering apparatus according to the embodiment of the present invention.
Figure 6B:
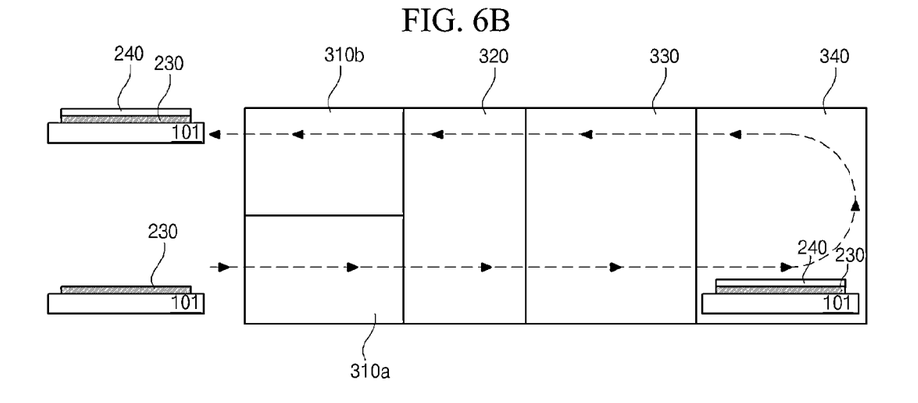
Figure 7:
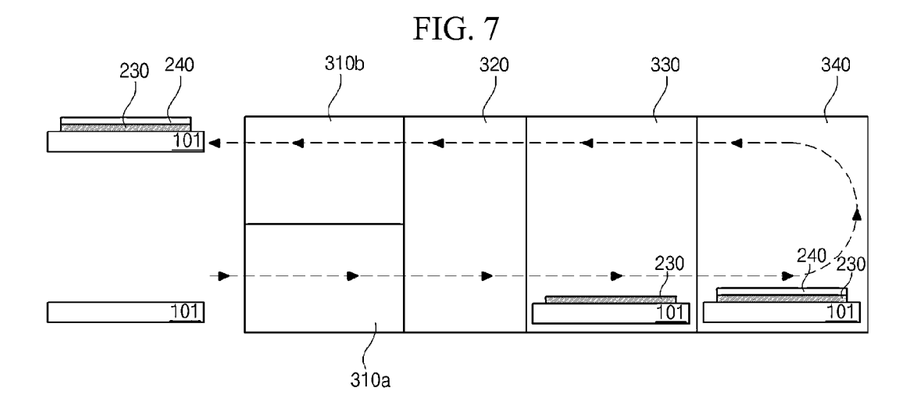
FIG. 7 is a schematic view illustrating processes of forming pixel and common electrodes using an inline type sputtering apparatus according to another embodiment of the present invention.

In the embodiment, the $O_2$ plasma treatment may be performed in a first treatment chamber 330 that is used to form the first conductive material layer 230, or in a second treatment chamber 340 that is used to form the second conductive material layer 240 (see FIGS. 6A, 6B and 7).

In more detail, in an instance using the first treatment chamber 330, the first conductive material layer 230 is formed in the first treatment chamber 330, then an $O_2$ gas is supplied into the first treatment chamber 330, and then the first conductive material layer 230 is oxidized in the first treatment chamber 330. In an alternative instance using the second treatment chamber 340, the first conductive material layer 230 is formed in the first treatment chamber 330, then the substrate 101 having the first conductive material layer 230 is transferred to the second treatment chamber 340, and then an $O_2$ plasma treatment is performed for the first conductive material layer 230 in the second treatment chamber 340 before forming the second conductive material layer 240.

The $O_2$ plasma treatment may be performed in the first or second treatment chamber 330 or 340 in a condition that a degree of vacuum is about 80 mTorr to about 120 mTorr, a power is about 800 W to about 1000 W, a flow rate of $O_2$ is about 10 sccm to about 20 sccm, and a treatment time is about 40 seconds to about 100 seconds. However, the present invention is not limited thereto.

When the first conductive material layer 230 is exposed to the $O_2$ gas, a condition of the chamber 330 or 340, i.e., the vacuum degree, the power and the flowing rate, has a similar or equal range with the condition for the $O_2$ plasma.

Because of the $O_2$ plasma treatment for the first conductive material layer 230, the second conductive material layer 240 can be prevented from growing along a direction of crystallization growth of the first conductive material layer 230.

In more detail, when a second conductive material is formed on a first conductive material as the related art without an oxidization of the first conductive material layer, the second conductive material grows along a direction of crystallization growth of the first conductive material. Accordingly, in an etching process, a part of the second conductive material is not etched but remains as residues in a granular form. However, due to the oxidation process, the growth of the second conductive material along the direction of crystallization growth of the first conductive material is prevented. Accordingly, a part of the second conductive material layer 240 not etched but remaining as residues in a granular form can be prevented. Therefore, reduction of response speed of liquid crystal, reduction of brightness and defects in rubbing an alignment layer due to the residues can be prevented.

Further, production efficiency can be improved, which will be explained in more detail as below.

Figure 5I:
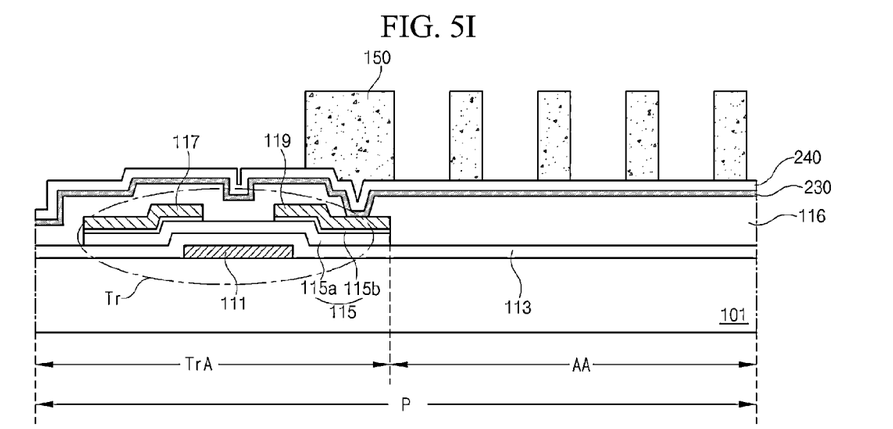

Then, referring to FIG. 5I, a photoresist is formed on the second conductive material layer 240, and a fourth mask process is performed. Accordingly, a photoresist pattern 150 is formed corresponding to regions to form pixel and common electrodes (114 and 112 of FIG. 5K). The photoresist pattern 150 has a width of about 3.1 μm which is a minimum size permissible in the light of resolution of a light exposure apparatus.

Figure 5J:
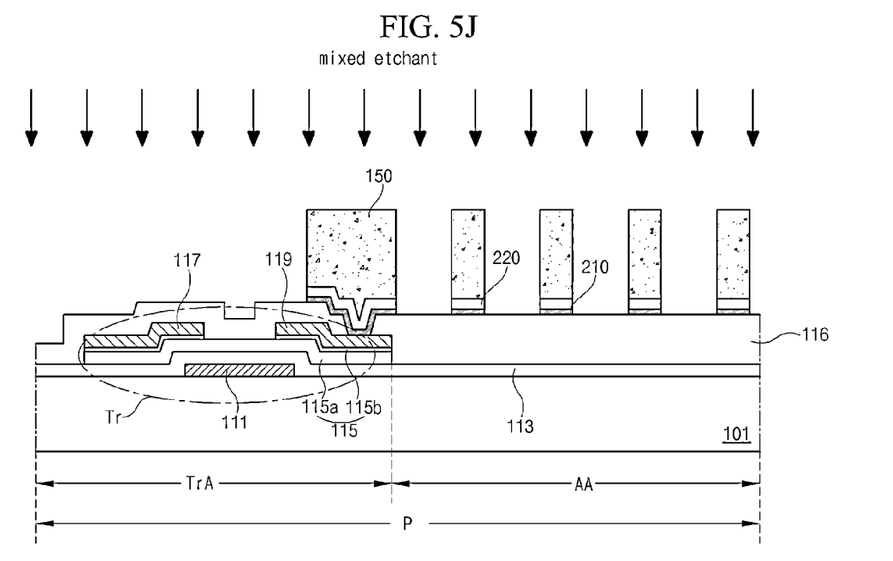

Then, referring to FIG. 5J, an etching process is performed for the first and second conductive material layers 230 and 240 using the photoresist pattern 150. The etching process may be performed with a mixed etchant to simultaneously etch the first and second conductive material layers 230 and 240. For example, an etchant including hydrogen peroxide ($H_2O_2$), ammonium fluoride ($NH_4F$) and benzotriazole (BTA) or an etchant including hydrogen peroxide ($H_2O_2$), ammonium fluoride ($NH_4F$) and aminotetrazole (ATZ) may be used. The etching process may be performed in about 100 seconds to about 300 seconds.

When the first and second conductive material layers 230 and 240 are exposed to the etchant, because of a galvanic phenomenon that occurs due to a potential difference between the different conductive materials, the second conductive material layer 240 is inward laterally etched below the photoresist pattern 150 at a relative faster rate while the first conductive material layer 230 is etched at a relative slower rate.

Accordingly, side surfaces and top peripheral surfaces of the first conductive material layer 230 are exposed, and by this action, side etching progresses below the photoresist pattern 150 having a width of about 3.1 μm. Accordingly, the pixel and common electrodes 114 and 112 each having a double-layered structure and having a width which is about 0.9 μm to about 2.6 μm less than that of the photoresist pattern 150 thereon can be formed.

The pixel electrode 114 is connected to the drain electrode 119 through the drain contact hole 116a. The common electrode 112 is connected to the common line through the common contact hole.

Figure 5K:
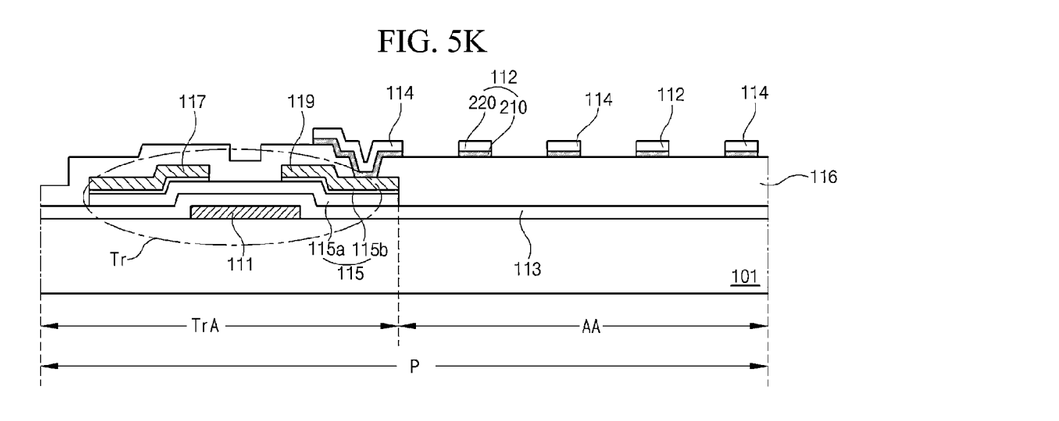

Then, referring to FIG. 5K, the photoresist pattern 150 on the pixel and common electrodes 114 and 112 is stripped and removed. Accordingly, the array substrate for the LCD device can be manufactured.

The array substrate is attached to an opposing substrate, for example, a color filter substrate with a liquid crystal layer therebetween to manufacture the LCD device.

As described above, the pixel and common electrodes 114 and 112 are formed to have a double-layered structure using the different conductive materials. Accordingly, the pixel and common electrodes 114 and 112 have a narrow width, and aperture ratio can be thus improved. Further, reflectance for ambient light can be reduced, and ambient contrast ratio can be thus improved.

Further, in forming the double-layered pixel and common electrodes 114 and 112, the first conductive material layer 230 is oxidized using the $O_2$ plasma treatment. Accordingly, exposing the first conductive material layer 230 to the atmosphere can be prevented, and production efficiency can be thus improved.

Further, the second conductive material layer 240 can be prevented from growing along a direction of crystallization growth of the first conductive material layer 230. Accordingly, a part of the second conductive material layer 240 not etched but remaining as residues in a granular form can be prevented. Therefore, reduction of response speed of liquid crystal, reduction of brightness and defects in rubbing an alignment layer due to the residues can be prevented.

FIGS. 6A and 6B are schematic views illustrating processes of forming pixel and common electrodes using an inline type sputtering apparatus according to the embodiment of the present invention. FIG. 7 is a schematic view illustrating processes of forming pixel and common electrodes using an inline type sputtering apparatus according to another embodiment of the present invention.

Referring to FIGS. 6A, 6B and 7, the sputtering apparatus includes a load portion 310a, an unload portion 310b, a load lock chamber 320, and first and second treatment chamber 330 and 340. A substrate 101 may be transferred in an inline type.

In other words, the substrate 101 carried into the load portion 310a may be transferred from the load portion 310a in a sequence of the load lock chamber 320, the first treatment chamber 330 and the second treatment chamber 340, and then transferred to the unload portion 310b in the reverse sequence.

The load lock chamber 320 functions as a buffer against change of environment between the load and unload portions 310a and 310b and the first treatment chamber 330, for example, degree of vacuum, temperature, gas condition and the like. The first and second treatment chambers 330 and 340 function to deposit first and second conductive materials, respectively.

The load lock chamber 320 may include a heater that preheats the substrate 101 to increase deposition efficiency of the first and second treatment chambers 330 and 340.

The first and second treatment chambers 330 and 340 may be capable of rotating the substrate 101 for the substrate 101 to return back in a sequence of the first treatment chamber 330 (or, the second and first treatment chambers 340 and 330), the load lock chamber 320 and the unload portion 310b. When the substrate 101 reaches the unload portion 310b, the substrate 101 is carried out of the unload portion 310b.

The substrate 101 may be transferred in the sputtering apparatus by placing the substrate 101 on a carrier.

Processes of forming pixel and common electrodes (114 and 112 of FIG. 5K) having a double-layered structure with different conductive materials using the sputtering apparatus are explained in more detail as follows.

Referring to FIG. 6A, the substrate where a passivation layer (116 of FIG. 5K) is formed is transferred to the first treatment chamber 330 via the load portion 310a and the load lock chamber 320, and then a process of depositing a first conductive material layer 230 is performed.

When the deposition process is finished, the substrate 101 having the first conductive material layer 230 is carried out of the sputtering apparatus via the unload portion 310b, and the first conductive material layer 230 is exposed to the atmosphere. Accordingly, a surface of the first conductive material layer 230 is oxidized.

Then, referring to FIG. 6B, the substrate 101 is transferred to the second treatment chamber 340 via the load portion 310a and the load lock chamber 320, and then a process of depositing a second conductive material layer 240 on the oxidized first conductive material layer 230 is performed.

When the deposition process of the second conductive material layer 240 is finished, the substrate 101 is carried out of the sputtering apparatus. Through the above-described processes, depositing the first and second conductive material layers 230 and 240 is finished.

As described above, the first conductive material layer 230 is exposed to the atmosphere so that the second conductive material layer 240 can be prevented from growing along a direction of crystallization growth of the first conductive material layer 230.

In the instance of the above deposition processes, an alternative process may be, after forming the first conductive material layer 230, a gas exhaust is performed for the load lock chamber 320 to expose the first conductive material layer 230 to the atmosphere, and then the load lock chamber 320 is in a vacuum condition to form the second conductive material layer on the oxidized first conductive material layer 230.

However, the above step of the first conductive material layer 230 being exposed to the atmosphere, and the gas exhaust process and vacuum creation process for the load lock chamber 320 need very much time, and production cost increases. This causes reduction of production efficiency.

To improve the production efficiency, another embodiment shown in FIG. 7 may be employed.

Referring to FIG. 7, the substrate where a passivation layer (116 of FIG. 5K) is formed is transferred to the first treatment chamber 330 via the load portion 310a and the load lock chamber 320, and then a process of depositing a first conductive material layer 230 is performed.

When the deposition process is finished, the substrate 101 having the first conductive material layer 230 is transferred to the second treatment chamber 340, then an $O_2$ plasma treatment is performed to oxidize the first conductive material layer 230, and then a process of forming the second conductive material layer 240 on the oxidized first conductive material layer 230 is performed.

Alternatively, the $O_2$ plasma treatment may be performed in the first treatment chamber 330, and then the substrate 101 having the oxidized first conductive material layer 230 is transferred to the second treatment chamber 340 to form the second conductive material layer 240 on the oxidized first conductive material layer 230.

When the deposition processes of the first and second conductive material layers 230 and 240 are finished, the substrate 101 is carried out of the sputtering apparatus.

As described in above, in another embodiment, the first conductive material layer 230 is oxidized using the $O_2$ plasma treatment in the treatment chamber 330 or 340. Accordingly, exposing the first conductive material layer 230 to the atmosphere is eliminated, and production efficiency can be thus improved. Further, the second conductive material layer 240 can be prevented from growing along a direction of crystallization growth of the first conductive material layer 230.

Accordingly, a part of the second conductive material not etched but remaining as residues in a granular form can be prevented. Therefore, reduction of response speed of liquid crystal, reduction of brightness and defects in rubbing an alignment layer can be prevented.

It will be apparent to those skilled in the art that various modifications and variations can be made in the invention without departing from the spirit or scope of the invention. Thus, it is intended that the invention cover the modifications and variations of this invention provided they come within the scope of the appended claims and their equivalents.

What is claimed is:

1. A method of manufacturing an array substrate for a liquid crystal display device, comprising:
    forming gate and data lines crossing each other on a substrate to define a pixel region;
    forming a thin film transistor connected to the gate and data lines;
    forming a passivation layer on the substrate having the gate lines, data lines and the thin film transistor;
    forming a first conductive material layer on the passivation layer and connected to a drain electrode of the thin film transistor;
    oxidizing a surface of the first conductive material layer;
    forming a second conductive material layer on the oxidized first conductive material layer;
    forming a photoresist pattern on the second conductive material layer;
    etching the first and second conductive material layers using the photoresist pattern to form pixel and common electrodes which are alternately arranged in the pixel region and produce an in-plane electric field; and
    removing the photoresist pattern.

2. The method according to claim 1, wherein the step of oxidizing comprises exposing the surface of the first conductive material layer in atmosphere.

3. The method according to claim 1, wherein step of oxidizing comprises exposing the surface of the first conductive material layer in an oxygen (O2) gas.

4. The method according to claim 1, wherein step of oxidizing comprises exposing the surface of the first conductive material layer in an oxygen (O2) plasma.

5. The method according to claim 1, wherein the first conductive material layer is formed of an opaque conductive material, and the second conductive material layer is formed of a transparent material.

6. The method according to claim 5, wherein the opaque conductive material is molybdenum (Mo), molybdenum-titanium (MoTi), copper (Cu) or copper nitride (CuNx), and the transparent material is indium-tin-oxide (ITO), indium-zinc-oxide (IZO) or aluminum-doped zinc-oxide (AZO).

7. The method according to claim 1, wherein the second conductive material layer is thicker than the first conductive material layer.

8. The method according to claim 1, wherein the step of oxidizing is performed in a chamber, which is used to form the first conductive material layer, and the step of oxidizing is performed after forming the first conductive material layer.

9. The method according to claim 1, wherein the step of oxidizing is performed in a chamber, which is used to form the second conductive material layer, and step of oxidizing is performed before forming the second conductive material layer.

10. The method according to claim 4, wherein the step of exposing the surface of the first conductive material layer in the oxygen (O2) plasma is performed in about 40 seconds to about 100 seconds at a flow rate of oxygen of about 10 sccm to about 20 sccm according to claim 1, further comprising forming a gate cap on the gate.

11. The method according to claim 4, wherein the step of exposing the surface of the first conductive material layer in the oxygen (O2) plasma is performed at a degree of vacuum of about 80 mTorr to about 120 mTorr.

12. The method according to claim 1, wherein the step of etching the first and second conductive material layers uses an etchant which includes hydrogen peroxide (H2O2), ammonium fluoride (NH4F) and benzotriazole (BTA), or an etchant which includes hydrogen peroxide (H2O2), ammonium fluoride (NH4F) and aminotetrazole (ATZ).

* * * * *